(12) United States Patent
Yeo et al.

(10) Patent No.: US 7,087,482 B2
(45) Date of Patent: Aug. 8, 2006

(54) METHOD OF FORMING MATERIAL USING ATOMIC LAYER DEPOSITION AND METHOD OF FORMING CAPACITOR OF SEMICONDUCTOR DEVICE USING THE SAME

(75) Inventors: Jae-Hyun Yeo, Incheon (KR); Young-Sun Kim, Suwon-si (KR); Sung-Tae Kim, Seoul (KR); In-Sung Park, Seoul (KR); Gi-Vin Im, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 10/615,881

(22) Filed: Jul. 10, 2003

(65) Prior Publication Data
US 2004/0009679 A1    Jan. 15, 2004

Related U.S. Application Data

(63) Continuation-in-part of application No. 10/047,706, filed on Jan. 15, 2002, now Pat. No. 6,734,480.

(30) Foreign Application Priority Data
Jan. 19, 2001    (KR) .................................. 2001-3165
Jul. 18, 2002    (KR) ................................ 2002-42217

(51) Int. Cl.
*H01L 21/8242*    (2006.01)
(52) U.S. Cl. ...................... 438/240; 438/255; 438/396
(58) Field of Classification Search .................... 438/3, 438/240, 778, 783, 785, 253, 254, 255, 396, 438/398
See application file for complete search history.

(56) References Cited

U.S. PATENT DOCUMENTS

| | | | |
|---|---|---|---|
| 6,632,279 B1 * | 10/2003 | Ritala et al. ................. | 117/101 |
| 6,664,186 B1 * | 12/2003 | Callegari et al. ............ | 438/681 |
| 6,743,475 B1 * | 6/2004 | Skarp et al. ............ | 427/255.31 |
| 6,780,704 B1 * | 8/2004 | Raaijmakers et al. ....... | 438/239 |
| 2003/0040196 A1 * | 2/2003 | Lim et al. ................... | 438/785 |
| 2004/0009307 A1 * | 1/2004 | Koh et al. .................. | 427/569 |
| 2004/0065253 A1 * | 4/2004 | Tois et al. ..................... | 117/84 |

* cited by examiner

Primary Examiner—Tuan H. Nguyen
(74) Attorney, Agent, or Firm—Harness, Dickey & Pierce

(57) ABSTRACT

Disclosed are methods of forming dielectric materials using atomic layer deposition (ALD) and methods of forming dielectric layers from such materials on a semiconductor device. The ALD process utilizes a first reactant containing at least one alkoxide group that is chemisorbed onto a surface of a substrate and then reacted with an activated oxidant that contains no hydroxyl group to form a dielectric material exhibiting excellent step coverage and improved leakage current characteristics.

10 Claims, 15 Drawing Sheets

METHOD OF FORMING MATERIAL USING ATOMIC LAYER DEPOSITION AND METHOD OF FORMING CAPACITOR OF SEMICONDUCTOR DEVICE USING THE SAME

CROSS-REFERENCE TO RELATED APPLICATIONS

This application is a Continuation-in-part of and claims priority under 35 U.S.C. § 120 to U.S. patent application Ser. No. 10/047,706 entitled "SEMICONDUCTOR CAPACITORS HAVING TANTALUM OXIDE LAYERS AND METHODS FOR MANUFACTURING THE SAME", which was filed on Jan. 15, 2002, now U.S. Pat. No. 6,734,480 the contents of which are herein incorporated by reference in its entirety. This application also claims priority under 35 U.S.C. § 119 from Korean Patent Application Nos. 2001-3165, filed Jan. 19, 2001, and 2002-42217, filed Jul. 18, 2002, the contents of which are also herein incorporated by reference in their entirety.

BACKGROUND OF THE INVENTION

1. Field of the Invention

The present invention relates to a method of manufacturing semiconductor devices, and more particularly, to a method of forming a material layer during the manufacture of semiconductor devices using the technique of atomic layer deposition (ALD) and a method of forming the dielectric layer of a capacitor of a semiconductor device using ALD.

2. Description of the Related Art

The decrease in cell capacitance resulting from a reduction in available memory cell area makes it difficult to increase the integration density of semiconductor memory devices. Decreased cell capacitance degrades the data readability from memory cells, increases the soft error rate and also hinders low-voltage operation of the semiconductor memory devices.

Several techniques have been utilized to maintain or increase the cell capacitance without significantly increasing the wafer area occupied by the memory cell. Two such methods of increasing capacitance within a limited cell area including thinning the dielectric layer of the capacitor and/or increasing the effective surface area of the capacitor lower electrode using a cylindrical or pin-shaped structure. However, for memory devices such as dynamic random access memories (DRAMs) having capacities of 1 gigabit or more, it is difficult to obtain sufficient capacitance to ensure satisfactory operation of the memory devices with either of the methods noted above.

To further increase the capacitance that can be achieved within a given memory cell size, research efforts have been directed toward the use of materials having a higher dielectric constant ($\kappa$), such as $Ta_2O_5$, $Y_2O_3$, $HfO_2$, $ZrO_2$, $Nb_2O_5$, $BaTiO_3$ or $SrTiO_3$, as the dielectric layer of a capacitor is being actively conducted.

Conventionally, a $Ta_2O_5$ film has been widely used because of its relatively high dielectric constant and high thermal stability. However, the use of the $Ta_2O_5$ film has a potential problem in that it typically is highly reactive with a polysilicon film. If the lower electrode of capacitor is formed from polysilicon, oxygen (O) from the $Ta_2O_5$ film can react with silicon of the polysilicon layer during the formation of the $Ta_2O_5$ film or during a subsequent thermal treatment after the $Ta_2O_5$ film has been formed to from silicon dioxide at the surface of the polysilicon layer. Further, oxygen vacancies within $Ta_2O_5$ film may increase leakage current.

In an attempt to address this problem, lower electrodes have been formed from materials that are believed to be relatively more difficult to oxidize than polysilicon. Examples of such materials include noble metals such as platinum (Pt), ruthenium (Ru) and iridium (Ir) or conductive metal nitride films such as titanium nitride (TiN). However, the use of a noble metal or a metal nitride presents other potential problems.

A conventional tantalum oxide ($Ta_2O_5$) film is typically formed by chemical vapor deposition (CVD) in an oxygen atmosphere using pentaethoxide tantalum (PET), $Ta(OCH_3)_5$ or $TaCl_5$ as a tantalum source gas and oxygen ($O_2$), water ($H_2O$), hydrogen peroxide ($H_2O_2$) or nitrous oxide ($N_2O$) as an oxygen source gas. Notwithstanding any advantages associated therewith, a composition of these source gases often negatively impacts the coverage of the $Ta_2O_5$ film, presumably due to the oxidation of the lower electrode. For example, if ruthenium (Ru) is used as a lower electrode, the surface of the Ru layer can be oxidized to form a $RuO_2$ film that minimizes or prevents the formation of the desired $Ta_2O_5$ film. This problem often occurs when a $Ta_2O_5$ film is used as a dielectric layer in a cylindrical or concave-shaped capacitor having a large aspect ratio. In such an instance, the $Ta_2O_5$ film will tend to be more thinly deposited or largely missing from the portion of the Ru electrode in the lower portion of a cylindrical opening, while the $Ta_2O_5$ film is thickly deposited on the upper portion of the opening, thereby resulting in poor step coverage of the resulting $Ta_2O_5$ film.

Generally, thin films such as dielectric films are formed using deposition methods such as CVD, low-pressure chemical vapor deposition (LPCVD), plasma-enhanced chemical vapor deposition (PECVD) and/or sputtering. The step coverage that is typically obtained with CVD-based methods, however, remained less then desired. Accordingly, atomic layer deposition (ALD) processes have been proposed as an alternative to CVD-based deposition methods because the ALD processes can be performed at lower temperatures while exhibiting improved step coverage.

One such ALD process technology is disclosed in U.S. Pat. No. 6,124,158, in which a first reactant is introduced to react with the treated surface to form a bonded monolayer of reactive species. A second reactant is then introduced to react with the bonded monolayer to form a thin layer of the desired material on the treated surface. After each step in the cycle, the reaction chamber is purged with an inert gas to prevent reaction except at the treated surface.

Since an ALD film has low thermal budget, excellent step coverage, and excellent thickness control and uniformity, efforts have been made to develop methods whereby a metal oxide such as $Ta_2O_5$, $Y_2O_3$, $HfO_2$, $ZrO_2$, or $Nb_2O_5$, may be deposited using an ALD method to form the high-κ dielectric layer of a capacitor. One such effort formed a metal oxide by ALD using as the metal precursor a halide such as $HfCl_4$ in combination with an oxidant such as $O_2$, $H_2O$, $H_2O_2$ or $N_2O$. However, efforts of forming such thin films using halide group precursors tend to result in unsatisfactory levels of step coverage.

Further, when $H_2O$ is used as the oxidant, hydrogen (H) radicals tend to react with halogen ligands separated from $HfCl_4$ to thereby form a gas including hydrochloric acid (HCl). Because the HCl gas tends to etch the thin film on the semiconductor device, the surface morphology of the resulting thin film is compromised. In addition, the metal may combine with the —H and/or —OH groups formed, resulting in the incorporation of undesirable impurities, e.g., metal hydroxides, into the metal oxide film. If a metal oxide film containing impurities such as metal hydroxides is utilized as a dielectric layer in a semiconductor device, the metal hydroxides may act as trap sites or a current leakage sites, thereby degrading the dielectric characteristics of the resulting device.

SUMMARY OF THE INVENTION

In an exemplary embodiment, the present invention provides a method of forming a material using atomic layer deposition (ALD) having improved step coverage and leakage current preventing characteristics.

In an exemplary embodiment, the present invention provides a method of forming a semiconductor capacitor having a large aspect ratio in which oxidization of the lower electrode is suppressed in order to form a metal oxide thin film having improved uniformity.

In an exemplary embodiment, the present invention provides a method of forming a material utilizing an ALD process comprising the steps of: (a) introducing a first reactant containing a first atom necessary to form the material and at least one alkoxide group on a substrate; (b) chemisorbing a portion of the first reactant onto the substrate; (c) introducing a second reactant that is activated and does not contain a hydroxyl group to the substrate; and (d) chemically reacting the second reactant with the chemisorbed first reactant to form an atomic layer of the material on the substrate.

In an exemplary embodiment, the atomic layer formed on the substrate can serve as a dielectric layer of a capacitor for a semiconductor device or as a gate dielectric layer for a semiconductor device.

In an exemplary embodiment, the present invention provides a method of forming a thin film using an ALD process comprising the steps of: (a) placing a substrate into a chamber; (b) introducing a first reactant including a metal alkoxide into the chamber; (c) chemisorbing a portion of the first reactant onto the substrate; (d) removing non-chemically adsorbed first reactant from the chamber; (e) introducing a second reactant as an activated oxidant that lacks a hydroxyl group into the chamber; (f) chemically reacting the second reactant with the chemisorbed first reactant to form an atomic layer of a metal oxide film on the substrate; and (g) removing the non-chemically reacted second reactant from the chamber.

In an exemplary embodiment, the present invention provides a method of forming a capacitor comprising the steps of: (a) forming a first electrode on a semiconductor substrate; (b) introducing a first reactant containing a first atom for forming a dielectric material and at least one alkoxide group on the first electrode; (c) chemisorbing a portion of the first reactant onto the first electrode; (d) introducing a second reactant containing no hydroxyl group on the first electrode; (e) chemically reacting the second reactant with the chemisorbed first reactant to form a dielectric layer on the first electrode; and (f) forming a second electrode on the dielectric layer.

According to an exemplary embodiment, the present invention involves an ALD process in which a metal alkoxide precursor and an oxidant that contains no hydroxyl group may be reacted to form a thin film having improved step coverage and an improved leakage current characteristics. When such a thin film is used as the capacitor dielectric layer or as the gate dielectric layer in a semiconductor device, the reliability of the resulting semiconductor device may also be improved.

BRIEF DESCRIPTION OF THE DRAWINGS

Exemplary embodiments of the present invention will become apparent by reference to the following detailed description when considered in conjunction with the accompanying drawings wherein.

DESCRIPTION OF EXEMPLARY EMBODIMENTS

Hereinafter, the preferred embodiments of the present invention will be described in detail with reference to the accompanying drawings. In the following drawings, the same numerals are used to indicate the same or corresponding elements.

FIGS. 1A to 1E are cross-sectional views illustrating a method of forming a material using atomic layer deposition according to an exemplary embodiment of the present invention.

Figure 1A:
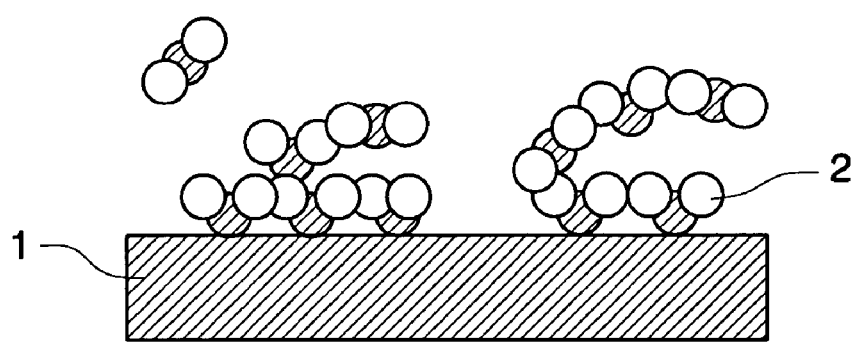
FIGS. 1A to 1E are cross-sectional views illustrating a method of forming a material using atomic layer deposition according to an exemplary embodiment of the present invention.

Referring to FIG. 1A, a substrate 1 including a semiconductor material such as silicon (Si) is placed into a deposition chamber (not shown). A first reactant 2 containing a first atom (e.g., a metal or a semimetal) necessary to produce the desired material and at least one alkoxide group as a ligand is then introduced into the chamber. In an exemplary embodiment, the first reactant 2 is a metal alkoxide. The metal alkoxide may include a second group metal alkoxide including at least one second group metal such as magnesium (Mg), calcium (Ca) or strontium (Sr), a third group metal alkoxide including at least one third group metal such as boron (B), aluminum (Al) or lanthanum (La) (even though boron is considered a semimetal), a fourth group metal alkoxide including at least one fourth group metal such as titanium (Ti), zirconium (Zr), hafnium (Hf), silicon (Si), germanium (Ge), tin (Sn) or lead (Pb) (even though silicon and germanium are more commonly considered semimetals) and a fifth group metal alkoxide including at least one fifth group metal such as vanadium (V), niobium (Nb), tantalum (Ta), phosphorus (P), arsenic (As) or antimony (Sb) (even though P is not generally considered a metal and As and Sb are more commonly considered semimetals). In an exemplary embodiment of the present invention, the metal alkoxide is a fourth group metal alkoxide.

An example of a Mg alkoxide is $Mg[OC_2H_4OCH_3]_2$, an example of a Ca alkoxide is $Ca[OC_2H_4OCH_3]_2$, and an example of a Sr alkoxide is $Sr[OC_2H_4OCH_3]_2$. Examples of B alkoxides include $B[OCH_3]_3$, $B[OC_2H_5]_3$, $B[OC_3H_7]_3$ and $B[OC_4H_9]_3$, examples of Al alkoxides include $Al[OC_2H_4OCH_3]_2$, $Al[OCH_3]_3$, $Al[OC_2H_5]_3$, $Al[OC_3H_7]_3$ and $Al[OC_4H_9]_3$, and examples of La alkoxides include $La[OC_2H_4OCH_3]_2$ and $La[OC_3H_7CH_2OC_3H_7]_3$.

Examples of Ti alkoxides include $Ti[OCH_3]_4$, $Ti[OC_3H_7]_4$, $Ti[OC_4H_9]_4$ and $Ti[OC_2H_5]_2[OC_2H_4N(CH_3)_2]_2$, examples of Zr alkoxides include $Zr[OC_3H_7]_4$, $Zr[OC_4H_9]_4$ and $Zr[OC_4H_8OCH_3]_4$, examples of Hf alkoxides include $Hf[OC_4H_9]_4$, $Hf[OC_4H_8OCH_3]_4$, $Hf[OC_4H_9]_2[OC_2H_4N(CH_3)_2]_2$, $Hf[OC_4H_9]_2[OC_4H_8OCH_3]_2$, $Hf[OSi(C_2H_5)_3]_4$, $Hf[OC_2H_5]_4$, $Hf[OC_3H_7]_4$, $Hf[OC_4H_9]_4$ and $Hf[OC_5H_{11}]_4$. Examples of Si alkoxides include $Si[OCH_3]_4$, $Si[OC_2H_5]_4$, $Si[OC_3H_7]_4$, $HSi[OCH_3]_3$, $HSi[OC_2H_5]_3$, $Si[OCH_3]_3F$, $Si[OC_2H_5]_3F$, $Si[OC_3H_7]_3F$ and $Si[OC_4H_9]_3F$, examples of Ge alkoxides include $Ge[OCH_3]_4$, $Ge[OC_2H_5]_4$, $Ge[OC_3H_7]_4$ and $Ge[OC_4H_9]_4$, examples of an Sn alkoxide include $Sn[OC_4H_9]_4$ and $Sn[OC_3H_7]_3[C_4H_9]$, and examples of Pb alkoxides include $Pb[OC_4H_9]_4$ and $Pb_4O[OC_4H_9]_4$.

Examples of V alkoxides include $VO[OC_2H_5]_3$ and $VO[OC_3H_7]_3$, examples of Nb alkoxides include $Nb[OCH_3]_5$, $Nb[OC_2H_5]_5$, $Nb[OC_3H_7]_5$ and $Nb[OC_4H_9]_5$, examples of Ta alkoxides include $Ta[OCH_3]_5$, $Ta[OC_2H_5]_5$, $Ta[OC_3H_7]_5$, $Ta[OC_4H_9]_5$, $Ta[OC_2H_5]_4[OC_2H_4N(CH_3)_2]$ and $Ta[OC_2H_5]_4[CH_3COCHCOCH_3]$, examples of P alkoxides include $P[OCH_3]_3$, $P[OC_2H_5]_3$, $P[OC_3H_7]_3$, $P[OC_4H_9]_3$, $PO[OC_2H_5]_3$, $PO[OC_3H_7]_3$ and $PO[OC_4H_9]_3$, examples of As alkoxides include $As[OCH_3]_3$, $As[OC_2H_5]_3$, $As[OC_3H_7]_3$ and $As[OC_4H_9]_3$, and examples of Sb alkoxides $Sb[OC_2H_5]_3$, $Sb[OC_3H_7]_3$ and $Sb[OC_4H_9]_3$.

Figure 1B:
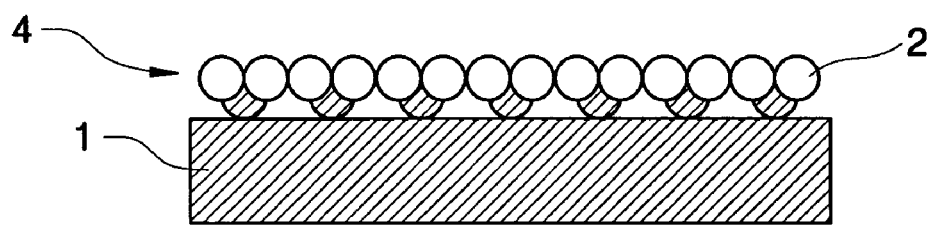

Referring to FIG. 1B, during the step of introducing the first reactant 2, a first portion of the first reactant 2 chemisorbs and forms a layer 4 on the surface of the substrate 1. A second portion of the first reactant 2 is physically attached (physisorbed) onto and is loosely held to the chemisorbed layer 4 of the first reactant 2. The chamber may then be purged with an inert gas such as argon (Ar) or nitrogen ($N_2$), and vacuum purged to remove the non-chemically absorbed portions of the first reactant 2 from the chamber, leaving the chemisorbed layer 4 of the first reactant 2 intact on the substrate 1.

Figure 1C:
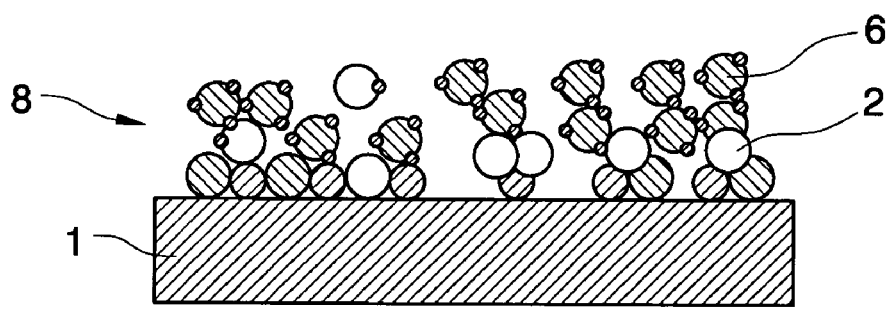

Referring to FIG. 1C, a second reactant 6 comprising an activated oxidant that does not contain a hydroxyl group is introduced into the chamber to chemically react the second reactant 6 with the chemisorbed first reactant 2, and thereby form an atomic layer 8 of the desired material on the substrate 1. The non-chemically reacted portion of the second reactant is then removed from the chamber. That is, the first atom (metal or non-metal) from the chemisorbed first reactant 2 reacts with oxygen of the second reactant 6 to form a metal oxide film as the unit of atomic layer. The second reactant 6 is an activated oxidant that can form oxygen (O) radicals and may be ozone ($O_3$), plasma $O_2$, remote plasma $O_2$ or plasma $N_2O$. When an oxygen gas is treated with an $O_3$ generator, a portion of $O_2$ gas is converted into $O_3$, thereby producing a mixed gas comprising $O_2$ and $O_3$ with the $O_3$ gas typically present in a mole percent of about 5 to 15%.

Figure 1D:
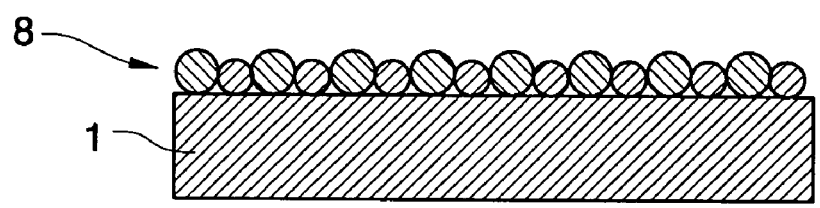
Figure 1E:
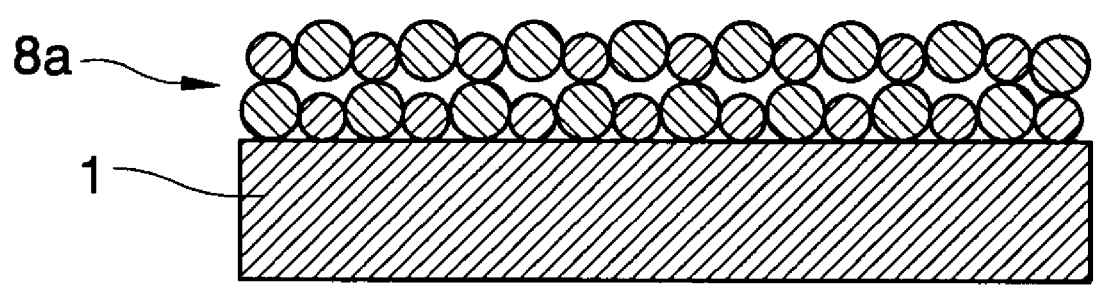

Referring to FIG. 1D, the chamber is then purged with an inert gas such as Ar or $N_2$, and then vacuum purged, to remove the non-chemically reacted portions of the second reactant 6 from the chamber.

The steps of introducing the first reactant, purging the first reactant, introducing the second reactant and purging the second reactant can be repeated to achieve any desired thickness of material layer 8a. The material layer 8a is an insulating layer, and may be a metal oxide layer including a metal oxide such as $HfO_2$, $ZrO_2$, $Ta_2O_5$, $Y_2O_3$, $Nb_2O_5$, $TiO_2$, $CeO_2$, $In_2O_3$, $RuO_2$, $MgO$, $SrO$, $B_2O_3$, $SiO_2$, $GeO_2$, $SnO_2$, $PbO$, $PbO_2$, $V_2O_3$, $La_2O_3$, $As_2O_5$, $As_2O_3$, $Pr_2O_3$, $Sb_2O_3$, $Sb_2O_5$, $CaO$ or $P_2O_5$.

Since metal alkoxides known as precursors for CVD processes tend to decompose at a higher temperatures, ALD processes using the metal alkoxide may be carried out at a temperature of between about 100 and 500° C., and may typically be carried out at a temperature of less than about 400° C. Metal alkoxides tend to have higher vapor pressures than that of other precursors, e.g., halide precursors under similar process conditions. A higher vapor pressure indicates that there are a relatively larger number of gas molecules when compared to a system having a lower vapor pressure. With respect to the metal alkoxides, the amount of metal source gas provided to the deposition chamber is relatively large, thus increasing the relative number of molecules made available for reaction at the bottom of the stepped region. Therefore, the metal alkoxide and other alkoxides employed as precursors in accordance with the exemplary embodiments of the present invention can form a thin film exhibiting improved step coverage when compared with conventional precursors.

In an exemplary embodiment, a thin film is formed using an ALD method using precursors of an alkoxide group, e.g., a tetra-butoxy-hafnium [$Hf(OtBu)_4$], and oxygen ($O_2$) gas may be formed with a lower thermal budget than a conventional CVD-$HfO_2$ film that would typically be deposited at a higher temperature of about 500° C. or more, thereby causing a higher thermal budget. Further, the ALD-$HfO_2$ film thickness may be controlled to a thickness of 20 Å or less, in comparison with the CVD-$HfO_2$ film that will typically be deposited to a thickness of at least several tens of Angstroms.

Ozone ($O_3$) gas used as an activated oxidant can oxidize a metal while generating no, or substantially no, by-products when compared with conventional oxidants. According to exemplary embodiments of the present invention, a second reactant that does not contain a hydroxyl group may be utilized to suppress the formation of undesirable impurities such as a metal-OH bond, thereby producing a thin film having improved stoichiometry and dielectric properties.

Hereinafter, a method of forming a $HfO_2$ film to act as the capacitor dielectric layer or gate dielectric layer using ALD process in accordance with an exemplary embodiment of the present invention will be described.

A substrate such as a silicon wafer is placed in a chamber that maintains a temperature of about 300 C. and the chamber is evacuated to a pressure of about 0.4 Torr. Using an inert carrier gas such as argon (Ar) or nitrogen ($N_2$), a flow of 200 sccm of a first reactant containing a first atom necessary for forming the desired dielectric film, i.e., hafnium, and an alkoxide group may be introduced into the chamber (on the substrate) for about 1 second. Although as the first reactant, one or more hafnium alkoxides such as $Hf(OEt)_4$, $Hf(OPr)_3$, $Hf(OBu)_4[Hf(OnBu)_4$, $Hf(OtBu)_4]$, $Hf(mmp)_4$, $Hf(OtBu)_2(dmae)_2$, $Hf(OtBu)_2(mmp)_2$ or $Hf[OSi(C_2H_5)_4$ may be used, $Hf(OtBu)_4$ was utilized in the exemplary embodiment described further below.

In the shorthand notation used above, "Et" denotes an ethyl group, "Pr" denotes a prophyl group, "nBu" denotes an n-butyl group, "tBu" denotes a t-butyl group, "dmae" denotes a dimethyaminoethoxide group ($—OC_2H_4N(CH_3)_2$) and "mmp" denotes a 1-methoxy-2-methyl-2-propoxy group ($—OC_4H_8OCH_3$).

During the introduction of the first reactant, a first portion of the $Hf(OtBu)_4$ chemisorbs and forms a layer on the surface of the substrate. A second portion of $Hf(OtBu)_4$ physically attaches (physisorbs) onto and is loosely held to the chemisorbed layer of $Hf(OtBu)_4$. $Hf(OtBu)_4$ is a liquid at a room temperature, may be represented by Formula I as illustrated below, and has a vapor pressure of 0.5 Torr at a temperature of 50.3° C.

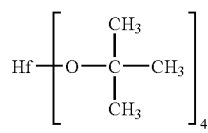

I

The chamber (substantially, the upper portion of the substrate) is purged with an inert gas such as Ar or $N_2$ and vacuum purged. During the purging steps, the non-chemically absorbed portions of $Hf(OtBu)_4$ are removed from the chamber while the chemisorbed layer of $Hf(OtBu)_4$ remains intact on the substrate.

A flow of 200 sccm of a second reactant comprising an activated oxidant containing no hydroxyl group, such as $O_3$, plasma $O_2$, remote plasma $O_2$ or plasma $N_2O$, is then introduced into the chamber for about 2 seconds. This allows an activated oxygen (O) from the second reactant to react with the chemisorbed $Hf(OtBu)_4$ on the substrate to form a $HfO_2$ film as an atomic layer on the substrate.

The chamber is then purged with an inert gas such as Ar or $N_2$ and then, vacuum purged to remove substantially all of the non-chemically reacted second reactant from the chamber. The steps of introducing $Hf(OtBu)_4$ into the chamber, purging the chamber, introducing the activated oxidant into the chamber and purging the chamber can be repeated as necessary to achieve any desired thickness of the resulting $HfO_2$ film. During these steps, in an exemplary embodiment, the temperature of the chamber is maintained at a temperature below about 400° C., such as a temperature of about 300° C.

According to exemplary embodiments of the present invention, hafnium alkoxide precursors such as $Hf(OtBu)_4$, which have a higher vapor pressure than other precursors such as hafnium halides such as $HfCl_4$, may be used to form a $HfO_2$ film with improved step coverage. Further, by using an activated oxidant that contains no hydroxyl group the formation of impurities in which a hafnium (Hf) bonds with —H or —OH may be suppressed or eliminated, thereby obtaining a $HfO_2$ film having improved stoichiometry that contains few or no impurities that could act as electron trap sites or current leakage sites.

After depositing the $HfO_2$ film with an ALD process using $Hf(OtBu)_4$ and $O_3$ as described above, various characteristics of the $HfO_2$ film were observed through the following experiments. In exemplary embodiments, the dosing step, Ar purging step, $O_3$ dosing step and Ar purging step were carried out for one second, two seconds, two seconds and two seconds, respectively. The ALD process was also performed at various exemplary deposition temperatures including 250° C., 300° C., 350° C. and 400° C.

Figure 2:
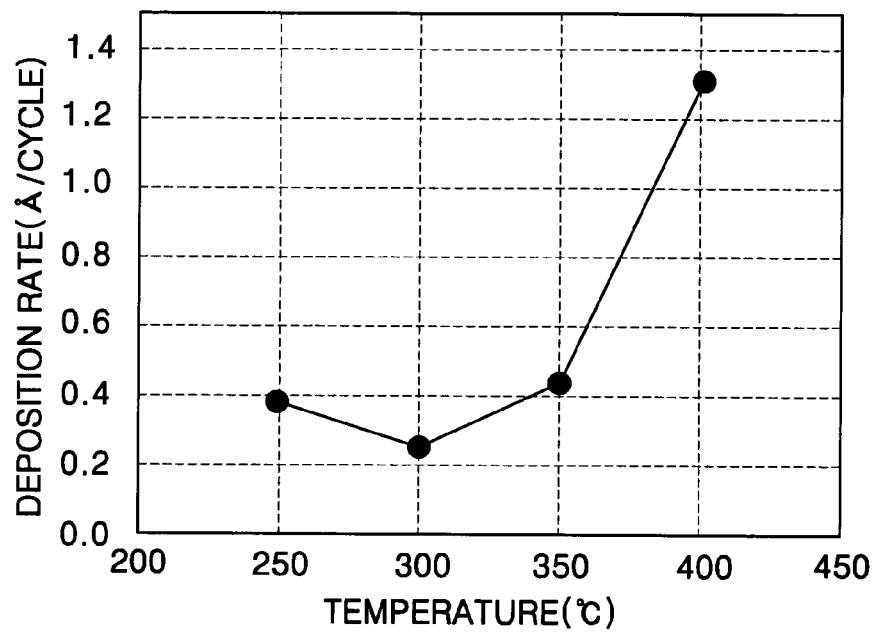
FIG. 2 is a graph showing a deposition rate of hafnium oxide ($HfO_2$) film versus the deposition temperature in accordance with an exemplary embodiment of the present invention.

FIG. 2 is a graph showing a deposition rate of $HfO_2$ film versus the deposition temperature. In the graph, the horizontal axis represents the deposition temperature (° C.) and the vertical axis represents the deposition rate (Å/cycle). As reflected in FIG. 2, the deposition rate of $HfO_2$ film was at a minimum at the deposition temperature of about 300° C. and increased at a temperature of about 400° C. Accordingly, the $HfO_2$ film exhibits stronger ALD characteristics when deposited at a temperature of in the vicinity of 300° C., while the properties of the film deposited at 400° C. or more begins to resemble those of a CVD-deposited film. Therefore, in an exemplary embodiment the $HfO_2$ film is deposited at a temperature of 400° C. or less, and in another exemplary embodiment, 250 to 350° C.

Figure 3:
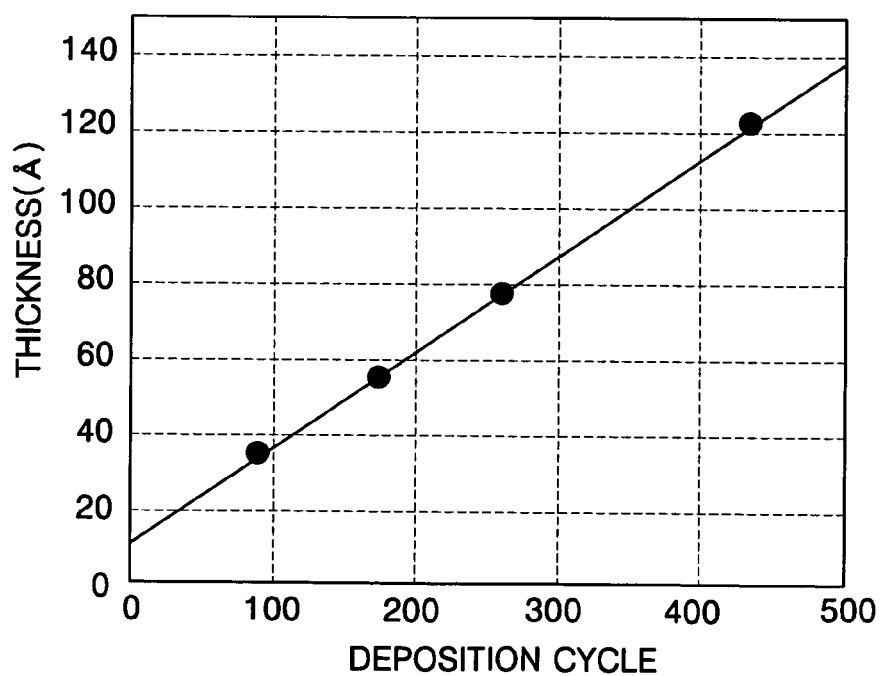
FIG. 3 is a graph showing a thickness of $HfO_2$ film versus the deposition cycle in accordance with an exemplary embodiment of the present invention.

FIG. 3 is a graph showing a thickness of $HfO_2$ film versus the deposition cycle. In the graph, the horizontal axis represents the deposition cycle and the vertical axis represents the film thickness. The deposition process was performed at a temperature of 300° C.

Referring to FIG. 3, since the $HfO_2$ film has ALD characteristics in the vicinity of 300° C., the thickness of $HfO_2$ film linearly increased in accordance with the deposition cycle. Accordingly, the $HfO_2$ film deposited by an ALD process using $Hf(OtBu)_4$ and $O_3$ exhibits improved thickness control and uniformity, thereby decreasing pattern loading effects. Further, for $HfO_2$ films deposited by an ALD process using $Hf(OtBu)_4$ and $O_3$, exhibited step coverage (the thickness ratio of the film formed on the upper portion of the structure to film formed on the lower portion of the structure) of about 80% or more on a structure having an aspect ratio of more than about 13:1.

Figure 4A:
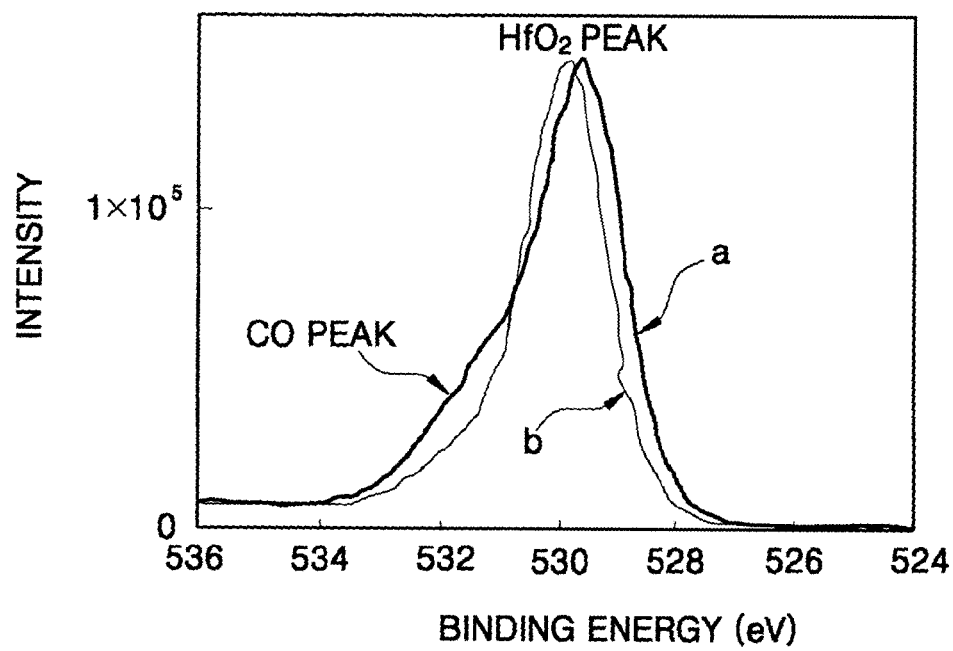
FIGS. 4A and 4B are graphs showing the binding status of $HfO_2$ film as a function of post annealing and deposition temperature respectively in accordance with an exemplary embodiment of the present invention.

FIG. 4A is a graph showing the binding status of oxygen examined through an X-ray photoelectric spectroscopy (XPS) analysis of as-deposited and post-annealed $HfO_2$ film. In FIG. 4A, a trace (a) indicates the binding status of as-deposited $HfO_2$ film, and a trace (b) indicates the binding status of post-annealed $HfO_2$ film. In the graph, the horizontal axis represents a binding energy (eV) and the vertical axis represents intensity.

Referring to FIG. 4A, a number of C—O bonds was detected in the as-deposited $HfO_2$ film. However, the C—O bonds within $HfO_2$ film nearly vanished and the Hf—O binding energy was shifted in the opposite direction of Hf metal phase after post-annealing. Accordingly, the binding status within the HfOx film was stabilized by the post-annealing.

Figure 4B:
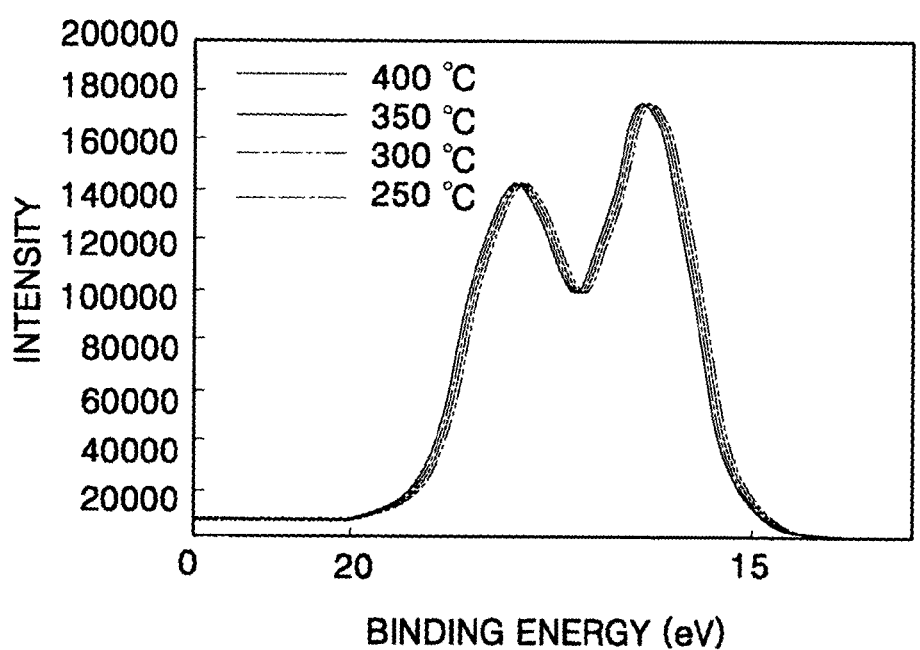

FIG. 4B is a graph showing the binding status of Hf examined through an XPS analysis of post-annealed $HfO_2$ film after the deposition of $HfO_2$ film was carried out at various temperatures. In FIG. 4B, the horizontal axis represents a binding energy (eV) and the vertical axis represents intensity. As reflected in FIG. 4B, the binding status of $HfO_2$ film appeared to be most stable for films formed at the deposition temperature of about 350° C.

Figure 5:
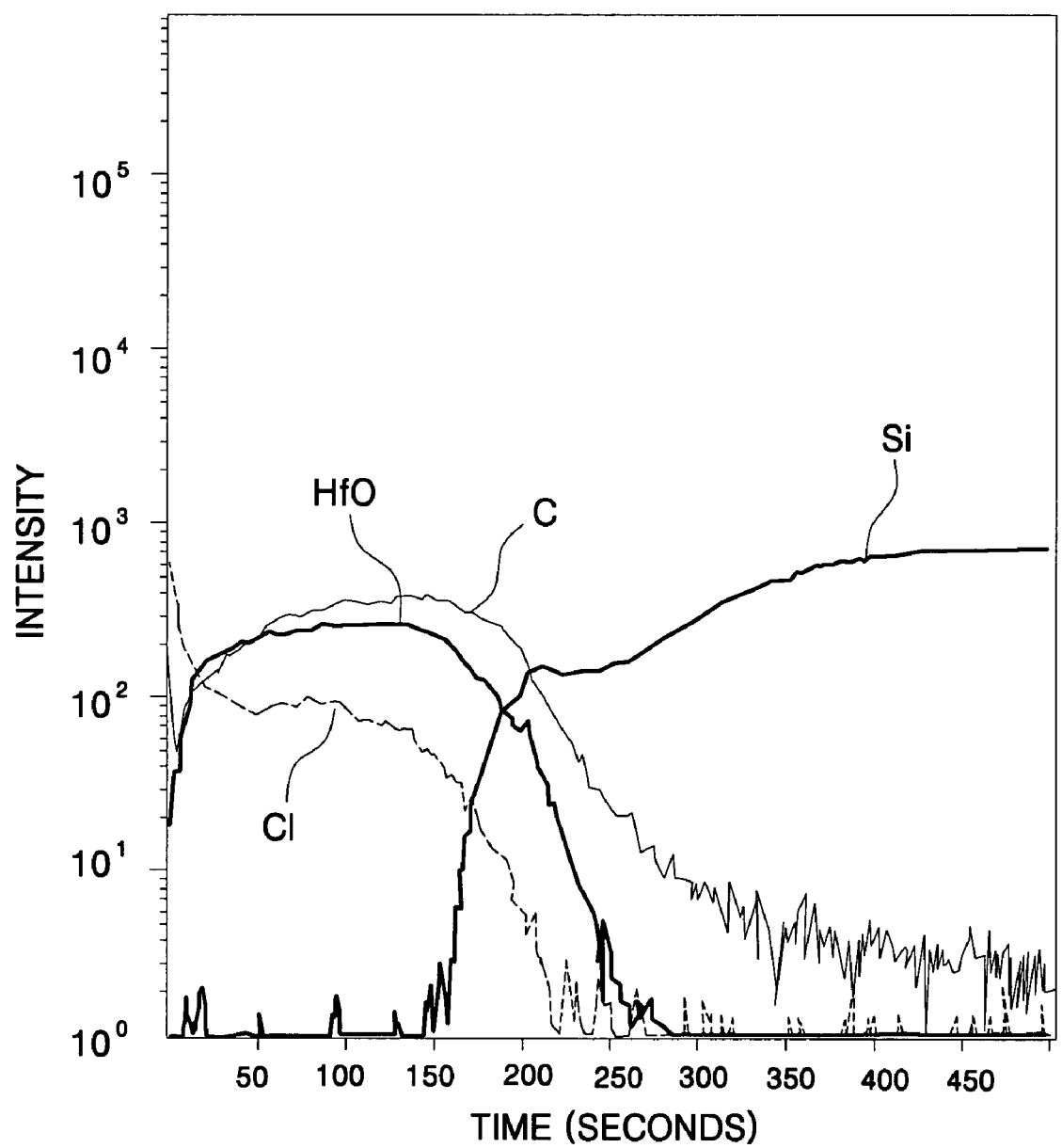
FIG. 5 is a graph showing a depth profile of a $HfO_2$ film formed according to an exemplary embodiment of the present invention.

FIG. 5 is a graph showing a depth profile of $HfO_2$ film in accordance with an exemplary embodiment of the present invention. The depth profile was observed by a time of flight-secondary ion-mass spectrometer (TOF-SIMS). In the graph, the horizontal axis represents time (seconds) and the vertical axis represents intensity. As reflected in FIG. 5, Hf—O bonds were uniformly detected in the $HfO_2$ film through the substantially full thickness of the $HfO_2$ film, confirming the formation of a generally uniform $HfO_2$ film that contains no significantly impurities such as $Hf(OH)_2$ that could act as electron trap sites or current leakage sites.

Exemplary Method Of Manufacturing A Semiconductor Device

Figure 6A:
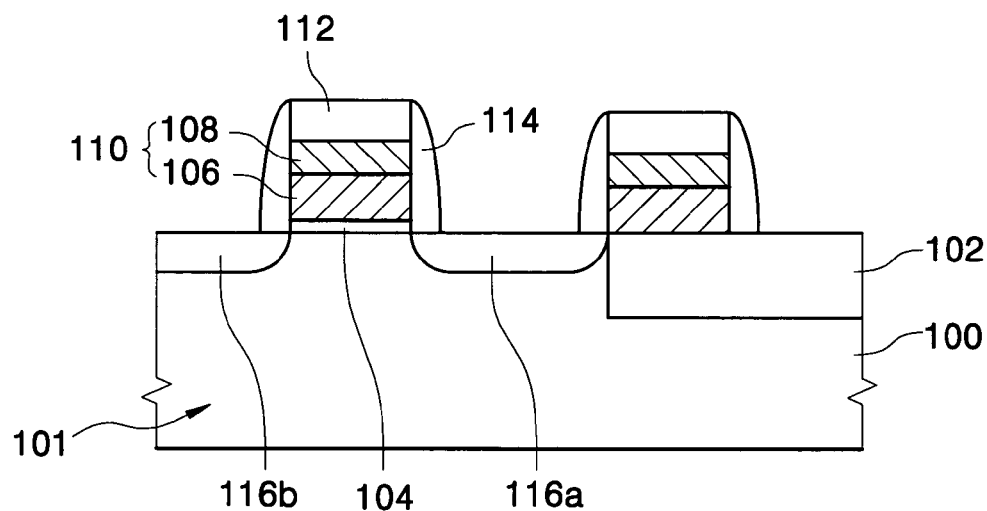
FIGS. 6A to 6E are cross-sectional views illustrating a method of manufacturing a semiconductor device in accordance with an exemplary embodiment of the present invention.

FIGS. 6A to 6E are cross-sectional views illustrating a method of manufacturing a semiconductor device in accordance with an exemplary embodiment of the present invention. Referring to FIG. 6A, a semiconductor substrate 100 is divided into an active region 101 and an isolation region (or field region) 102 on which are formed transistors including a gate dielectric layer 104, a gate electrode 110, and source/drain regions 116a and 116b. Since a very thin gate dielectric layer of about 10 Å is needed in a semiconductor memory device having a capacity of 1 gigabit or more, the gate dielectric layer 104 may be formed using an exemplary embodiment of the present invention. Specifically, as shown in FIGS. 1A to 1E, an ALD process using metal alkoxide precursors and an activated oxidant such as $O_3$, plasma $O_2$, remote plasma $O_2$ or plasma $N_2O$, may be utilized to form the gate dielectric layer 104 from a metal oxide film. In an exemplary embodiment, the gate dielectric layer 104 of $HfO_2$ is formed by an ALD process using $Hf(OtBu)_4$ and $O_3$.

In an exemplary embodiment, the gate electrode 110 may have a polycide structure including an impurity-doped polysilicon layer and a metal silicide layer stacked thereon. A capping insulating layer 112 and sidewall spacers 114 are formed on the top and side of the gate electrode 110, respectively. In an exemplary embodiment, the capping insulating layer 112 and sidewall spacers 114 may be formed from a silicon oxide, a silicon nitride or other suitable insulating material.

Figure 6B:
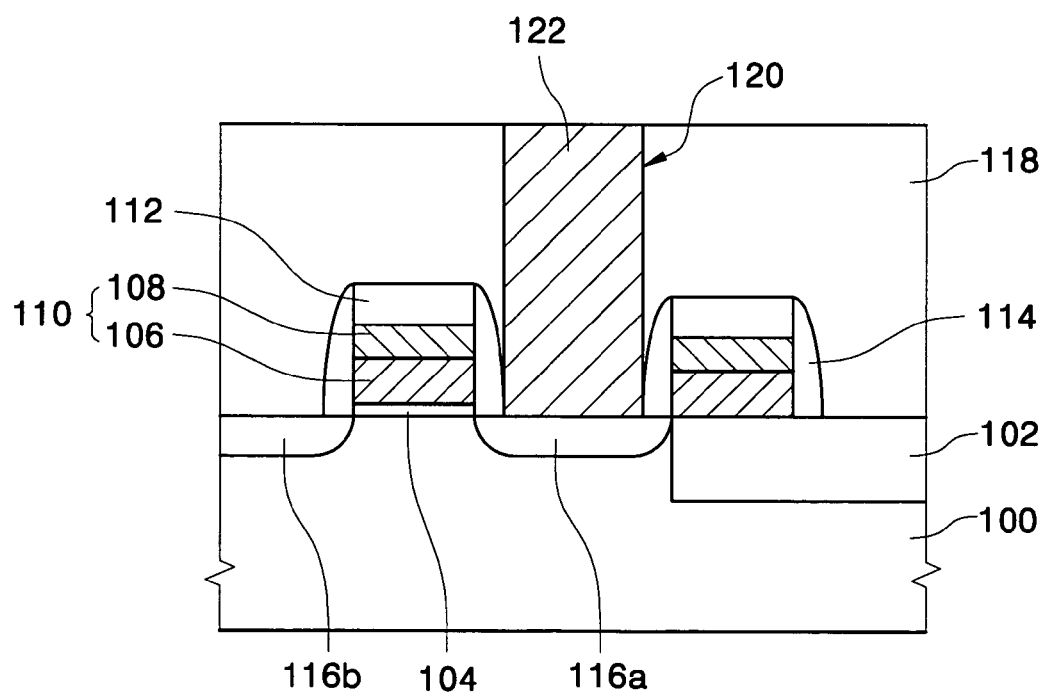

Referring to FIG. 6B, a first insulating layer 118 comprising an oxide is formed on the entire surface of the substrate 100 on which the transistors are formed. Then, a portion of the first insulating layer 118 is etched away through a photolithography process to thereby form a contact hole 120 to partially expose the source region 116a.

A first conductive layer, e.g., a P-doped polysilicon layer, is deposited on the contact hole 120 and the first insulating layer 118. Through an etch-back process or chemical-mechanical polishing (CMP) process, the first conductive layer is removed until the surface of the first insulating layer 118 is exposed, thereby forming a contact plug 122 in the contact hole 120.

Figure 6C:
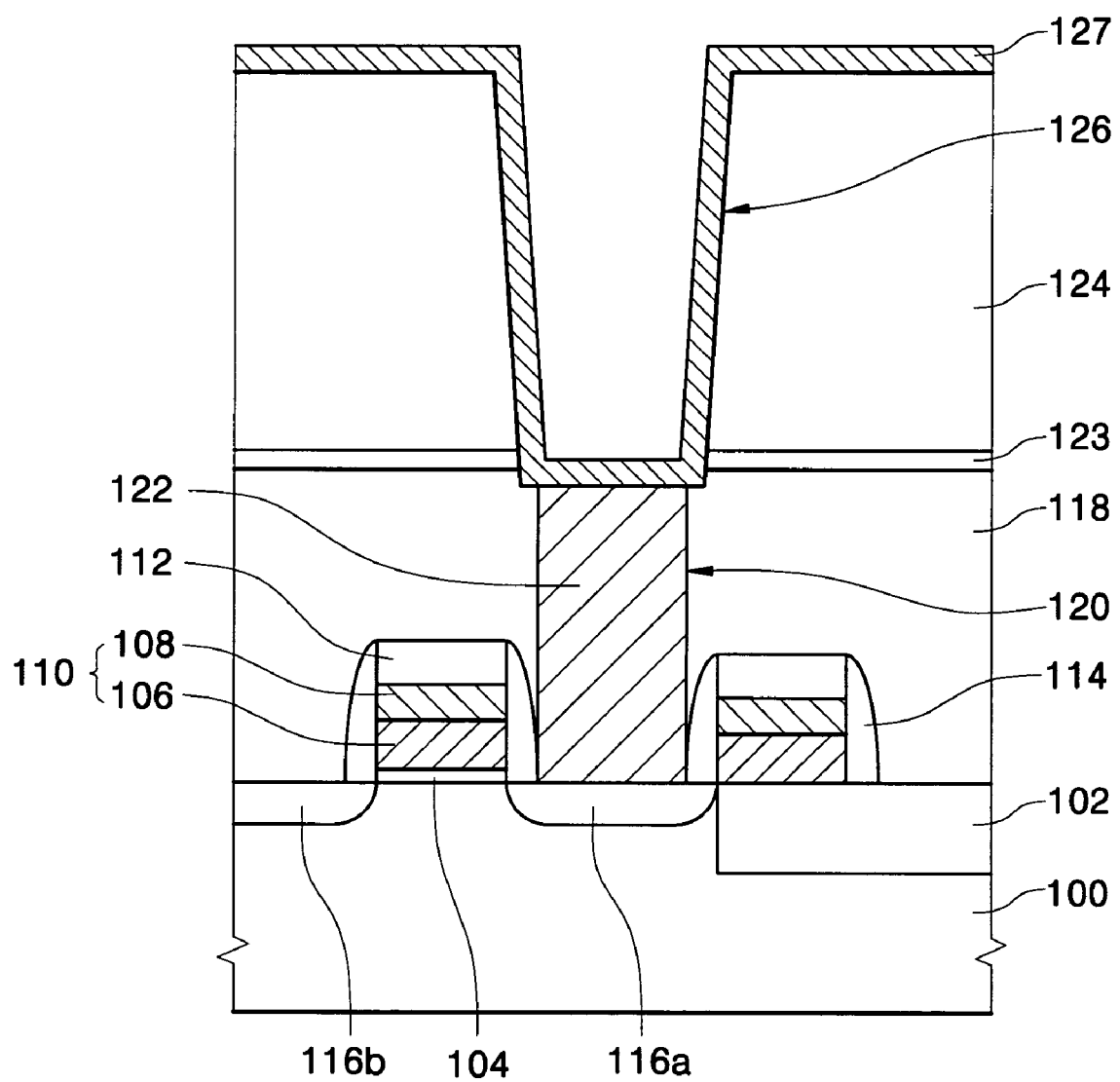

Referring to FIG. 6C, an etch stopping layer 123 is formed on the contact plug 122 and the first insulating layer 118. The etch stop layer 123 comprises a material having a high etch selectivity with respect to the first insulating layer 118, for example, silicon nitride ($Si_xN_y$) or silicon oxynitride (SiON) (that is, the etch rate of the first insulating layer 118 is much higher than the etch rate of the etch stopping layer 123 under similar etch conditions).

After forming a second insulating layer 124 comprising an oxide on the etch stop layer 123, a portion of the second insulating layer 124 and a portion of the etch stop layer 123 are etched away to form an opening 126 that exposes a surface of the contact plug 122. Specifically, after etching the second insulating layer 124 until the etch stopping layer 123 is exposed, an over-etching process is carried out for a desired time to complete opening 126 and expose a surface of the contact plug 122 and an adjacent portion of the first insulating layer 118. The opening 126 may be formed with a non-vertical sidewall slope such that the inlet of the opening 126 is wider than the bottom thereof. This is because the etch rate of the bottom of the opening 126 is decreased relative to the etch rate at the inlet of the opening 126 due to loading effects during the etching process.

A second conductive layer 127 is deposited on the side and bottom of the opening 126 and the top of the second insulating layer 124. In an exemplary embodiment, the second conductive layer 127 may comprise a semiconductor material such as polysilicon, noble metals such as Ru, Pt, Ir or a combination thereof, or a conductive metal nitride such as TiN, TaN, WN or a combination thereof.

Figure 6D:
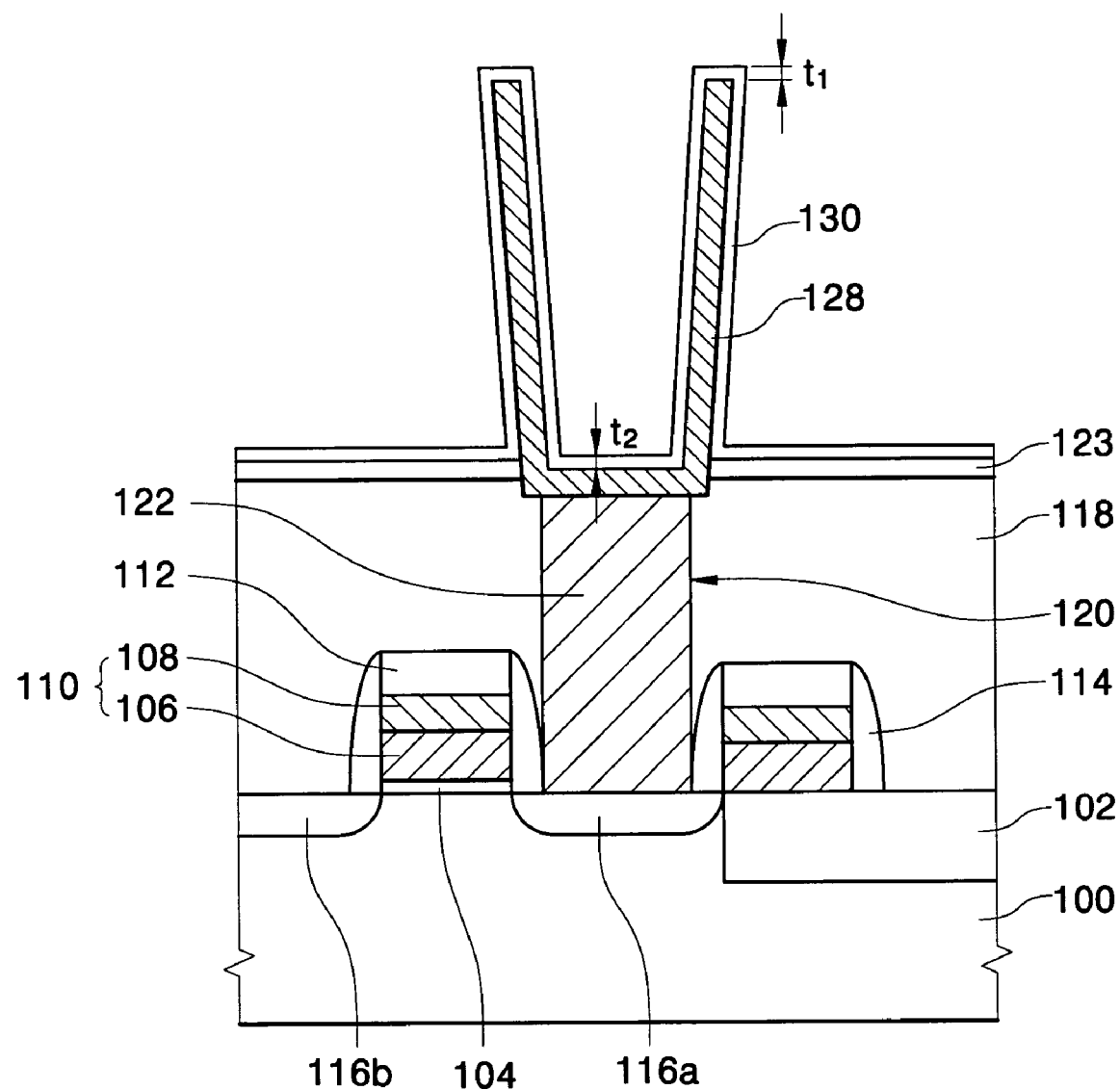
Figure 6E:
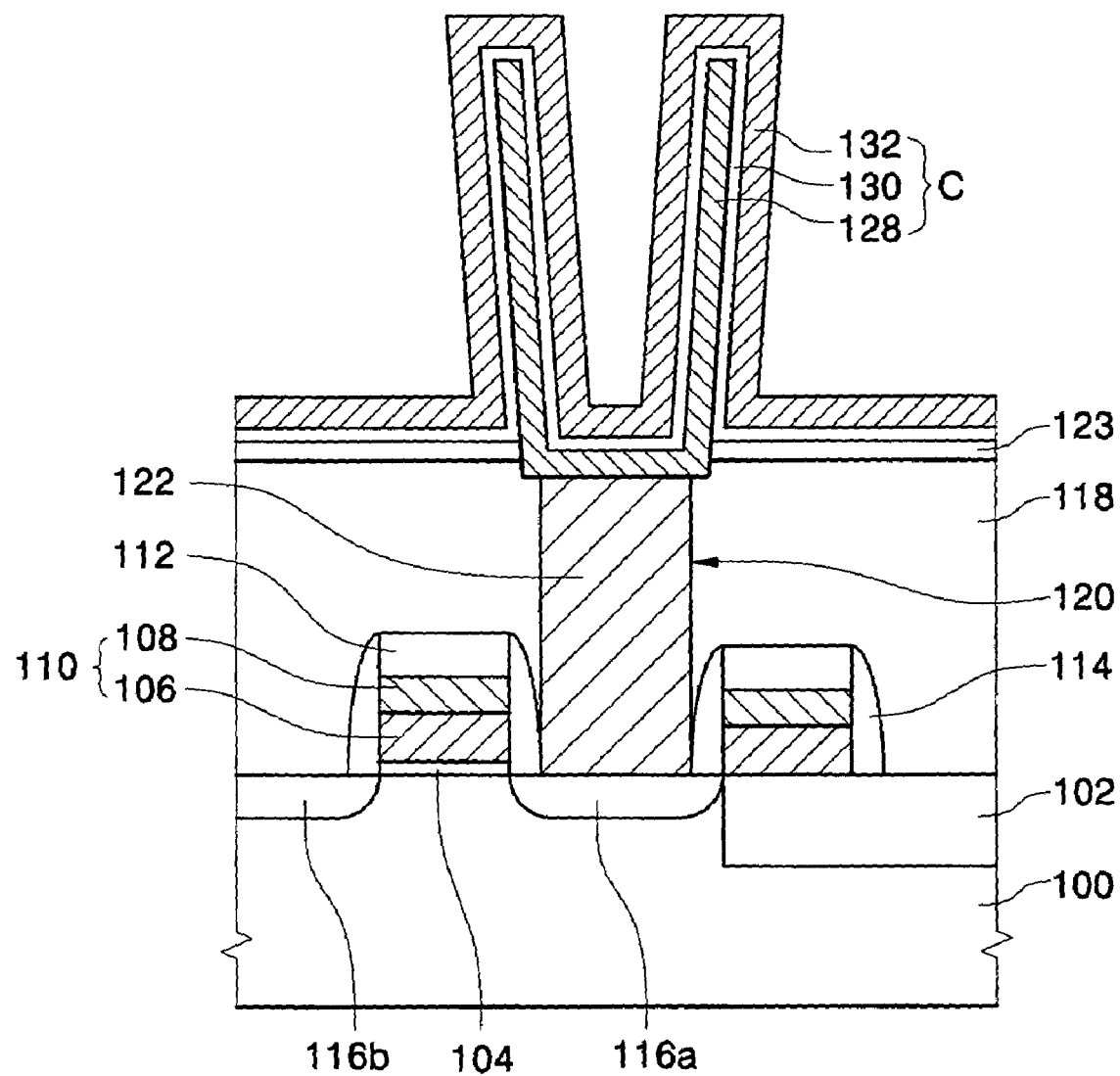

Referring to FIG. 6D, after forming a sacrificial layer (not shown) on the second conductive layer 127 and the opening 126, the upper portion of the sacrificial layer is etched back or otherwise removed such that the only remaining portion of the second conductive layer 127 is found on the side and bottom of the opening 126. By doing so, the second conductive layer 127 deposited on the surface of the second insulating layer 124 is removed to separate the second conductive layer 127 deposited along the profile of the opening 126 into a cell unit. The sacrificial layer is then removed to form a lower electrode 128 of a capacitor on each of the memory cell regions. The lower electrode 128 has a generally tapered cylindrical shape wherein the inlet is wider than the bottom and a height of about 10,000 to 17,000 Å.

Upon the lower electrode 128, as shown in FIGS. 1A to 1E, a layer of $HfO_2$ may then be deposited by an ALD process using hafnium alkoxide precursors such as $Hf(OtBu)_4$ and an activated oxidant such as $O_3$, plasma $O_2$, remote plasma $O_2$ or plasma $N_2O$, to form dielectric layer 130 of the capacitor. As described above, an ALD process using hafnium alkoxide precursors and an activated oxidant is utilized to obtain the dielectric layer 130 having an excellent step coverage in which the ratio of an upper thickness (t1) to a lower thickness (t2) is no less than 1:0.8 on a lower electrode 128 having an aspect ratio of 13:1 or more. The dielectric layer 130 may be formed from a single layer of $HfO_2$ or may be a composite layer of two or more metal oxides deposited sequentially For example, Hf and Al metal precursors utilized in the exemplary ALD process may be alternated to form a dielectric layer 130 having a stacked structure consisting of alternating $Al_2O_3$ and $HfO_2$ layers. The number and relative thickness of the layers in such heterogeneous dielectric layers may be adapted as desired to obtain a variety of dielectric films.

If the lower electrode 128 is formed from polysilicon, oxygen (O) separated from the oxidant may react with the silicon of the lower electrode 128 during the formation of the dielectric layer 130, thereby resulting in some oxidation of the lower electrode 128. Accordingly, before forming the dielectric layer 130 on a polysilicon electrode, a rapid thermal nitridation may be carried out in an atmosphere containing N₂ gas or ammonia to nitrify the surface of the lower electrode 128, thereby preventing or reducing the reaction of the oxidant used to form the dielectric layer 130 with the lower electrode 128.

Referring to FIG. 6D, after completing the formation of the dielectric layer 130 by the ALD process using metal alkoxide precursors and an ozone oxidant, the dielectric layer 130 may be annealed in an oxidizing atmosphere such as UV—O₃, to reduce or eliminate contaminants and cure oxygen defects.

An upper electrode 132 of the capacitor is deposited on the dielectric layer 130 to form the capacitor (C) including the lower electrode 128, the dielectric layer 130 and the upper electrode 132. The upper electrode 130 may comprise a semiconductor material such as polysilicon, noble metals including Ru, Pt, Ir or a combination thereof, or a conductive metal nitride including TiN, TaN, WN or a combination thereof. In an exemplary embodiment, the upper electrode 132 is formed as a stacked structure of TiN/polysilicon.

Figure 7:
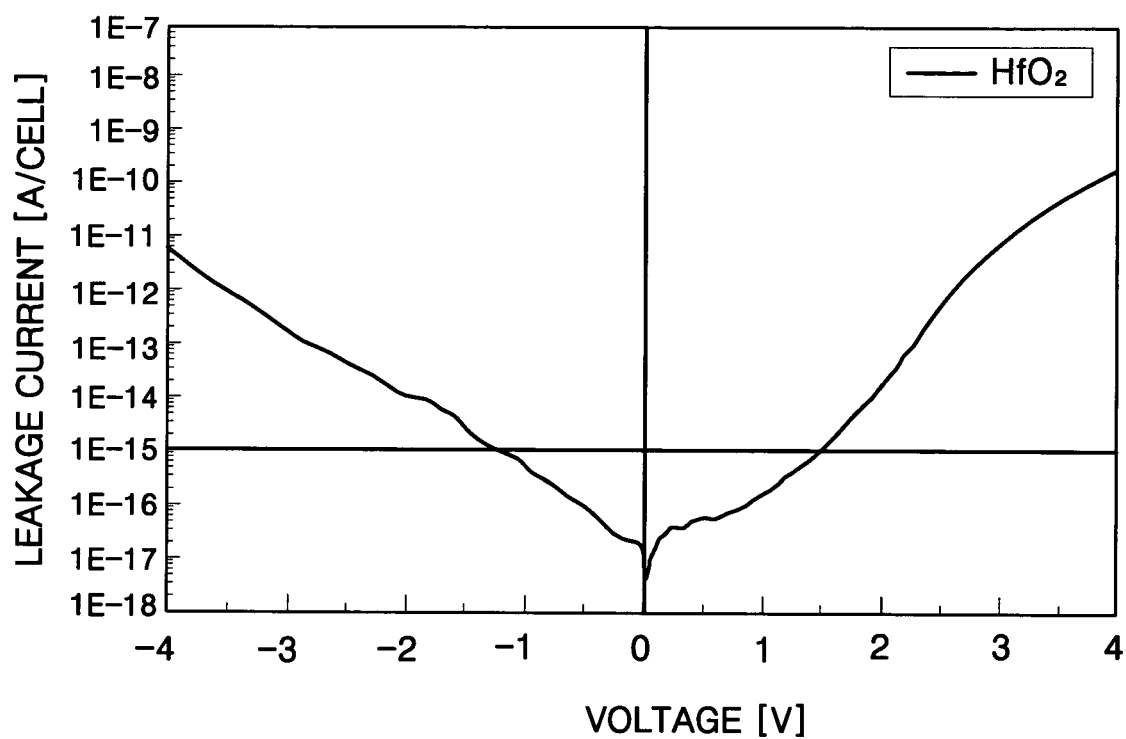
FIG. 7 is a graph showing the leakage current of a capacitor manufactured according to an exemplary embodiment of the present invention.

FIG. 7 is a graph showing a leakage current of the capacitor having a dielectric layer formed by the ALD process in accordance with an exemplary embodiment of the present invention. In the graph, the horizontal axis represents an applied voltage (V) and the vertical axis represents the measured leakage current (A/cell).

The capacitor was formed through the method shown in FIGS. 6A to 6E. Specifically, the surface of the lower electrode consisting of P-doped polysilicon was nitrified by rapid thermal process (RTP) using NH₃ gas. An exemplary ALD process using Hf(OtBu)₄ and O₃ was then used to form a first HfO₂ film to a thickness of about 20 Å that was annealed using UV—O₃. A second ALD HfO₂ film of about 50 Å was then deposited on the first ALD HfO₂ film using Hf(OtBu)₄ and O₃, followed by a second anneal using UV—O₃ to produce a HfO₂ film consisting of two atomic layers. A TiN film was then deposited on the HfO₂ film using TiCl₄ and NH₃ source gases and a P-doped polysilicon film was, in turn, deposited on the TiN film to form an upper electrode consisting having a TiN/polysilicon stacked structure.

As shown in FIG. 7, the capacitor manufactured according to exemplary embodiments of the present invention exhibits a leakage current of less than 1 fA/cell at 1V. Accordingly, capacitors utilizing a HfO₂ dielectric layer manufactured in accord with the exemplary embodiments of the present invention exhibits improved electric characteristics including a more stable leakage current, even when deposited on a electrode structure having an aspect ratio of 13:1 or more.

Second Exemplary Method of Manufacturing A Semiconductor Device

Figure 8:
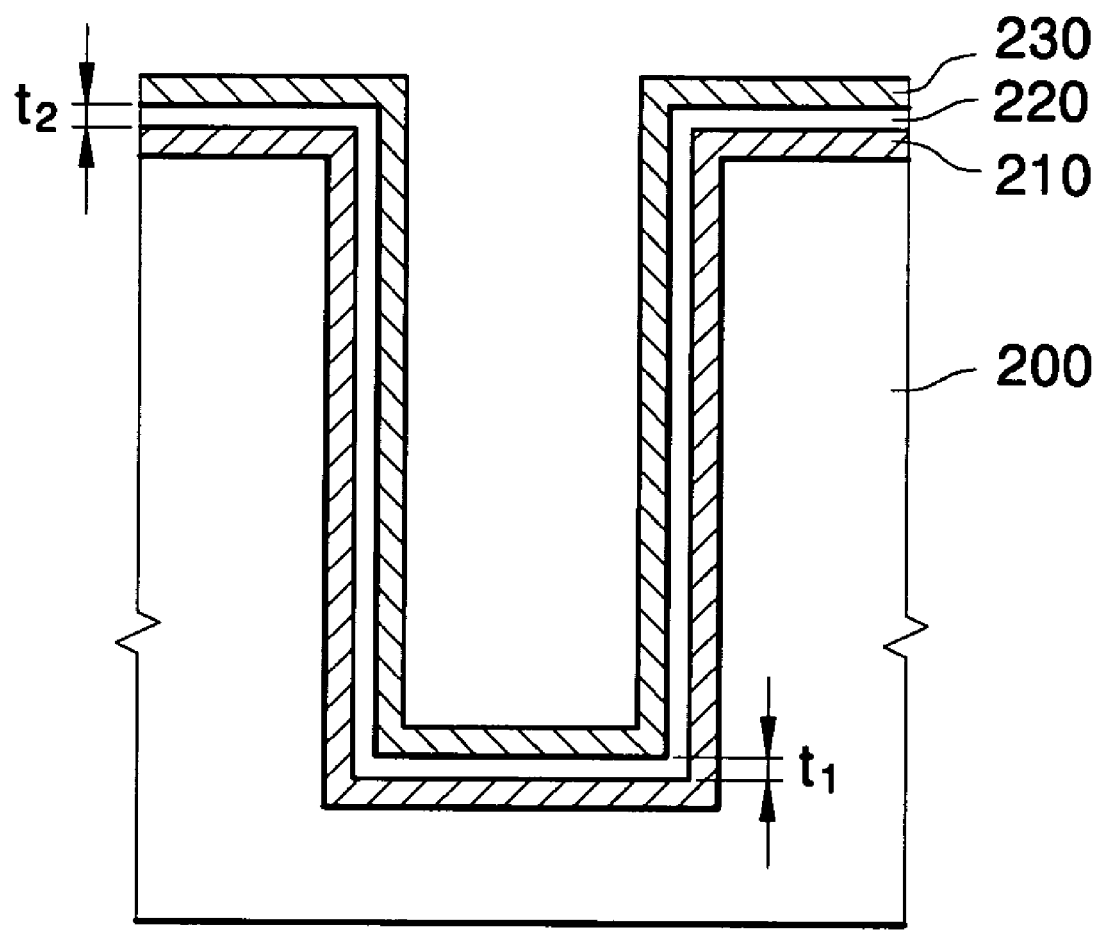
FIG. 8 is a cross-sectional view of a cylinder type capacitor in accordance with an exemplary embodiment of the present invention.

FIG. 8 is a cross-sectional view of a cylindrical capacitor in accordance with another exemplary embodiment of the present invention. Although as described in connection with this exemplary embodiment, the capacitor is cylindrical, it should be appreciated that the capacitor electrodes may be formed in a wide range of geometries.

Referring to FIG. 8, the cylindrical capacitor has a structure in which a TEOS layer 200 is patterned and etched to form a cylindrical shape on a semiconductor substrate (not shown). A lower electrode 210, a Ta₂O₅ dielectric layer 220 and an upper electrode 230, which then sequentially stacked along the TEOS layer 200. The lower electrode 210 and the upper electrode 230 may be comprise polysilicon, a noble metal such as Ru, Pt, Ir or a combination thereof, or a conductive metal nitride such as TiN, TaN, WN or a combination thereof In addition to embodiments utilizing a single metal nitride layer, a solid solution nitride layer such as (Ti, Ta)N can be used as the upper electrode, along with other materials. Similarly, a composite electrode formed by depositing or otherwise forming layers of at least two of the noted conductive materials described above can be used.

In exemplary embodiments of the present invention, the Ta₂O₅ layer is deposited using tantalum precursors of a monomer expressed by Formula II and ozone gas as source gases.

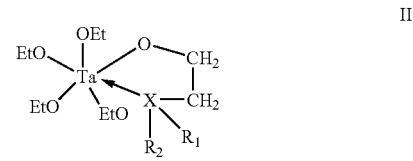

II

As shown in Formula II, X has a coordinate bond with Ta formed through an unshared electron pair. In an exemplary embodiment, X may be N, S, O, or C=O and R₁ and R₂ may be independently selected alkyl groups such as a C₁ to C₄ alkyl group. In an exemplary embodiment, R¹ and R₂ are methyl groups.

In an exemplary embodiment, ozone gas is used as an oxygen source for depositing the Ta₂O₅ layer. The O₃ gas can be used as an oxidizer for forming a Ta₂O₅ layer at a temperature below 400° C., in contrast to the thermal conditions employed using O₂, H₂O or N₂O. It should be appreciated that other temperature conditions can be employed.

The Ta₂O₅ layer can be formed by thermal chemical vapor deposition (CVD) or atomic layer deposition (ALD) techniques, as well as other techniques. According to the thermal CVD method, tantalum precursors and ozone gas simultaneously flow into a deposition chamber. Conversely, tantalum precursors and ozone gas sequentially flow into a deposition chamber to deposit a Ta₂O₅ layer using an ALD method.

One example of an ALD method of forming a Ta₂O₅ layer in accordance with exemplary embodiments the present invention may be carried out as follows. It should be appreciated that variations from this method can occur with departing from the scope of the invention.

A semiconductor substrate on which a lower electrode 210 is formed is introduced into a deposition chamber. A flow of 1–2000 sccm of a first reactant including a first atom, i.e., tantalum (Ta), for forming the desired thin film and at least one alkoxide group, i.e., tantalum precursors expressed by Formula II, is introduced into the chamber so that the first reactant is chemically or physically absorbed on the surface of an Ru electrode 210 of the semiconductor substrate. The tantalum precursors are typically provided by a bubbling method or a liquid delivery system (LDS) method.

After the adsorption is completed and a desired time has elapsed, a flow of 1–2000 sccm of an inert purge gas such as argon or nitrogen is introduced into the chamber to remove the remaining tantalum precursors from the chamber, while the adsorbed tantalum precursors remain in the chamber.

After the purge is completed, the inflow of the purge gas is stopped and a flow of 1–2000 sccm of a second reactant, i.e., ozone gas, is introduced into the chamber. The ozone gas then reacts with the adsorbed tantalum precursors to form a Ta₂O₅ layer. After the inside of the deposition chamber is again purged with an inert gas such as argon or nitrogen, a cycle of: (1) inflow of tantalum precursors, (2) inflow of purge gas, (3) inflow of ozone gas, and (4) inflow of purge gas may be carried out repeatedly to form a $Ta_2O_5$ layer 220 having a desired thickness.

During the deposition, the temperature of the chamber may range from about 100° C. to about 600° C., and the pressure of the chamber may range from about 0.1 Torr to about 30 Torr.

After the formation of the lower electrode 210 and before the formation of the $Ta_2O_5$ layer 220, a process for forming a tantalum preprocessed layer (not shown) can be additionally performed by repeating the inflow and purging of the tantalum precursors expressed by Formula II. This sequence can result in the simplification of the formation of the $Ta_2O_5$ layer. In such an exemplary embodiment, a thin $Ta_2O_5$ layer is formed on the lower electrode with the tantalum precursors. Due to the presence of the $Ta_2O_5$ layer, the oxidation of the lower electrode in an oxygen atmosphere may be reduced or prevented. Thus, a $Ta_2O_5$ layer having superior step coverage may be obtained.

An upper electrode 230 is formed on the dielectric layer 220, the dielectric layer 220 being fabricated as set fourth above. The upper electrode 230 can comprise polysilicon, a noble metal such as Ru, Pt, Ir or a combination thereof, or a conductive metal nitride such as TiN, TaN, WN or a combination thereof In addition to an employment of a single metal nitride layer, a solid solution nitride layer such as (Ti, Ta)N can be used as the upper electrode, along with other materials. Also, a composite layer formed by depositing at least two of the conductive materials described above can be used.

EXPERIMENT 1

A tantalum dielectric layer was formed on a cylindrical Ru lower electrode having an aspect ratio of about 15:1 using tetraethoxy tantalum dimethylamino-ethoxide (TAT-DMAE) as a tantalum precursor and $O_3$ gas as an oxygen source. The dielectric layer was formed by an ALD method having a cycle of inflow of tantalum precursors→purging→inflow of $O_3$ gas→purging. In this experiment, the temperature of the chamber was maintained at temperatures of 250° C., 300° C., 350° C. and 400° C. The thickness of the upper portion of a $Ta_2O_5$ layer deposited at each temperature ($t_1$ of FIG. 8) and the thickness of the lower portion of the $Ta_2O_5$ layer ($t_2$ of FIG. 8) were measured. The results of these measurements are shown below in Table 1.

TABLE 1

| Classification | 250° C. | 300° C. | 350° C. | 400° C. |
| --- | --- | --- | --- | --- |
| t1 (Å) | 240 | 103 | 233 | 244 |
| t2 (Å) | 220 | 102 | 207 | 228 |

As shown in Table 1, the thicknesses of the deposited layers vary with temperature. Notwithstanding these differences, it was observed that the $Ta_2O_5$ layer exhibited thickness uniformity of at least about 90% with respect to the layer formed on upper portions and lower portions.

COMPARATIVE EXAMPLE 1

For comparison with the present invention, a $Ta_2O_5$ layer was formed by ALD method at a temperature of 350° C. using PET as the tantalum precursor and $O_2$ and $H_2O$ gases as the oxygen sources, respectively.

Figure 9A:
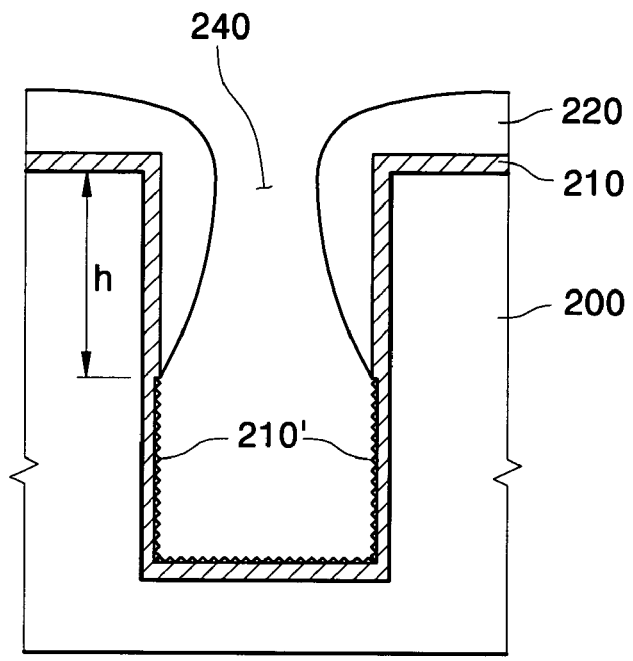
FIGS. 9A and 9B are schematic views showing a cross-section of a substrate photographed by scanning electron microscope (SEM), in case that a $Ta_2O_5$ films are formed using $H_2O$ and $O_2$ as an oxygen source, respectively in accordance with an exemplary embodiment of the present invention.
Figure 9B:
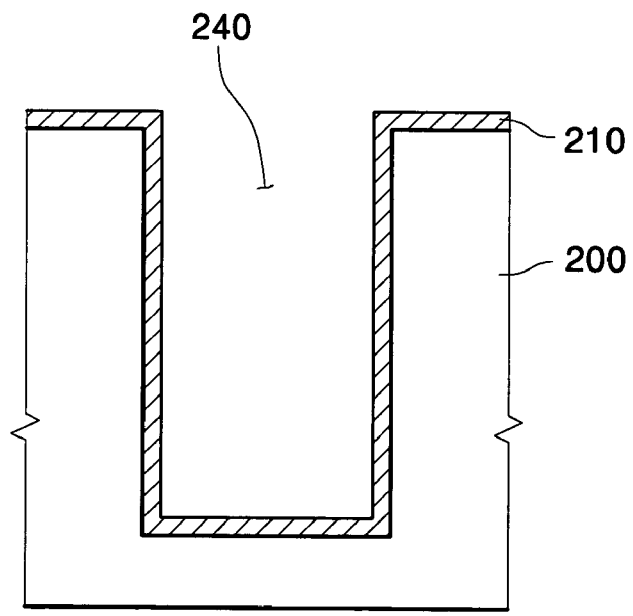

FIGS. 9A and 9B schematically illustrates sections of the substrate when $Ta_2O_5$ layers are formed using the above-mentioned oxygen sources.

When $H_2O$ was employed as the oxygen source gas, the $Ta_2O_5$ layer 220 was deposited on the upper portion of the opening 240, but the $Ta_2O_5$ layer 220 was not deposited on the lower portion of the opening 240. It is believed that the formation of the $Ta_2O_5$ layer 220 was prevented due to the presence of $RuO_2$ 210' formed by surface oxidation of the Ru layer 210 under the opening 240.

As shown in FIG. 9B, when $O_2$ is employed as the oxygen source gas, no $Ta_2O_5$ layer was deposited on the entire surface of the opening 240.

COMPARATIVE EXAMPLE 2

$Ta_2O_5$ layers were formed by ALD method at temperatures of 250° C., 300° C., 350° C. and 400° C. using PET as tantalum precursor and $O_3$ as an oxygen source.

This example illustrates similar results to Comparative Example 1 that employed $H_2O$ as the oxygen source gas. Referring to FIG. 9A, the $Ta_2O_5$ layer 220 was deposited on the upper portion of the cylindrical opening 240 at each temperature, but the $Ta_2O_5$ layer was not deposited on the lower portion of the opening 240. Further, as the deposition temperature was increased, the depth to which the $Ta_2O_5$ layer 220 was formed (designated as h in FIG. 9A) tended to increase. Table 2 illustrates the thicknesses (designated as $t_1$ and $t_2$ in FIG. 8) of the upper portion and lower portion of the $Ta_2O_5$ layer 220 formed at 300° C. and 350° C., and also the depth to which the $Ta_2O_5$ layer 220 was formed (designated as h in FIG. 9A).

TABLE 2

| Classification | 300° C. | 350° C. |
| --- | --- | --- |
| t1 (Å) | 549 | 456 |
| t2 (Å) | ~0 | ~0 |
| H (Å) | 3300 | 6700 |

Although not intending to be bound by theory, one possible reason as to why tantalum precursors of exemplary embodiments of the present invention expressed by Formula II display superior coverage to other tantalum precursors such as PET will be described with respect to steric hindrance believed to be attributable to equilibrium vapor pressure and sticking probability impacting the tantalum precursor molecular structure.

Figure 10:
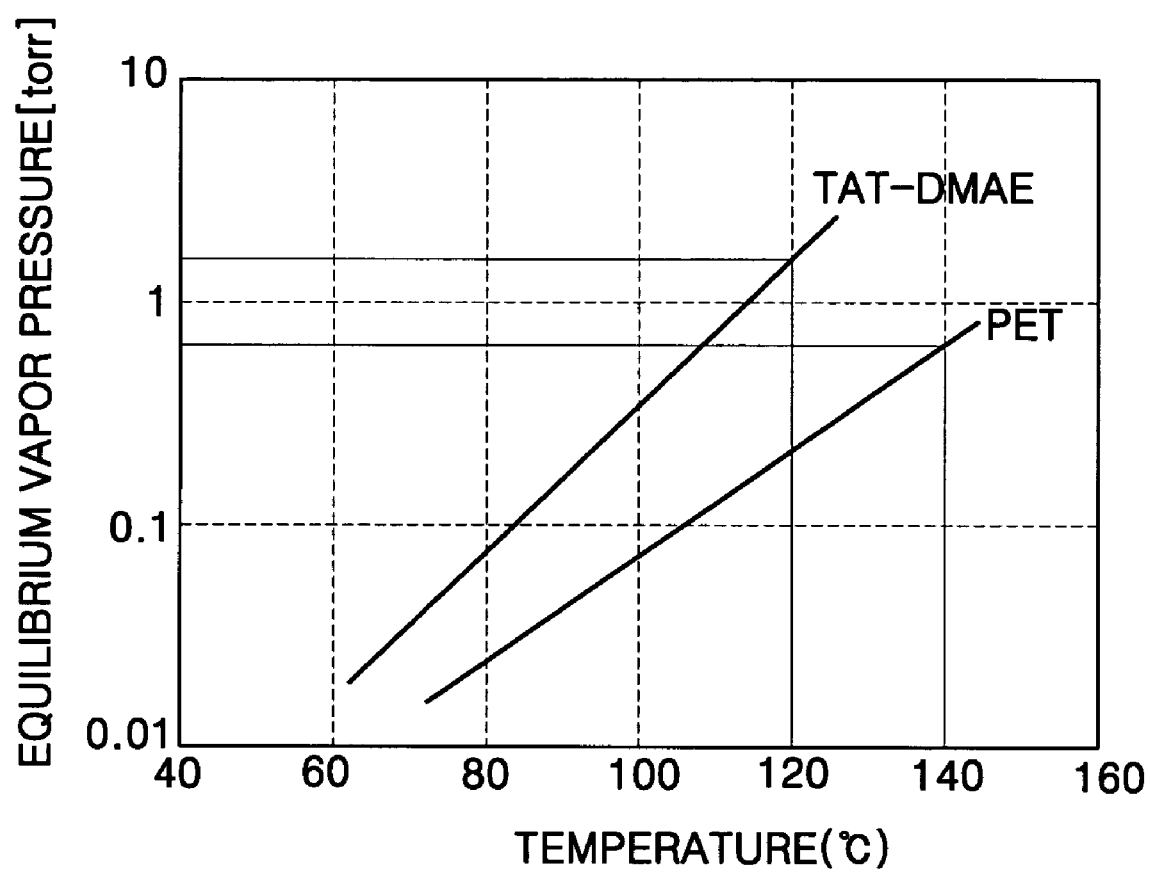
FIG. 10 is a graph showing equilibrium vapor pressures of PET and TAT-DMAE precursors versus temperature in accordance with an exemplary embodiment of the present invention.

FIG. 10 illustrates equilibrium vapor pressure with respect to temperatures of PET and TAT-DMAE. As reflected in FIG. 10, the equilibrium vapor pressure of TAT-DMAE is higher than that of PET. Therefore, at the same temperature, the equilibrium vapor pressure of TAT-DMAE is generally higher than that of PET over a given temperature range. In accordance with exemplary embodiments of the present invention, since a tantalum precursor source gas is provided at 140° C. with respect to PET and at 120° C. with respect to TAT-DMAE, the equilibrium vapor pressure of TAT-DMAE is observed to be about twice as great as that of PET. A high equilibrium vapor pressure indicates that there are a greater number of gas molecules relative to a system having a lower equilibrium vapor pressure. With respect to a TAT-DMAE system, the amount of tantalum source gas provided into the deposition chamber is sizeable. Accordingly, the number of molecules directly provided to the lower portion of the cylindrical opening is believed to be relatively large. Therefore, TAT-DMAE employed as precursors in accordance with exemplary embodiments of the present invention can form a $Ta_2O_5$ layer exhibiting superior coverage to the conventional PET.

Not intending to be bound by theory, it is believed that the discrepancies in vapor pressures can be attributed to a steric effect. According to Bradley, "Metal Alkoxides as Precursors for Electronic and Ceramic Materials" American Chemical Society, Chem. Rev., (1989), small alkoxides have a greater tendency to form oligomers such as dimers, trimers, etc. by bridging alkoxide groups than alkoxides having greater steric bulk. This discrepancy is believed to exert a sizeable influence on alkoxide vapor pressure.

Accordingly, since an oxygen atom present in PET has a tendency to increase its coordination number by forming a covalent bond with a neighboring tantalum atom, the PET is likely to have the following molecular structure in a liquid state (see Formula III).

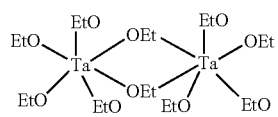

III

Conversely, with respect to a TAT-DMAE embodiment, because a nitrogen atom, which has a covalent bond with oxygen, has a coordination bond with a Ta atom, the TAT-DMAE exists as a monomer in a liquid state and can be expressed by the following structural formula (see Formula IV).

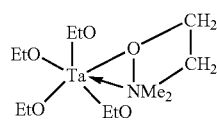

IV

Accordingly, it is believed that since PET has a higher thermal stability than the TAT-DMAE precursors utilized in the exemplary embodiments of the present invention, the PET requires more energy to break a bond between molecules to be volatilized and thus has a lower vapor pressure.

Another factor that potentially influences precursor coverage relates to sticking probability. According to Kawahara, "Conformal Step Coverage of (Ba, Sr)$TiO_3$ Films Prepared by Liquid Source CVD Using Ti(t-$BuO_2$)$_2$(DPM)$_2$", Japanese Journal of Applied Physics, Vol. 38, pp. 2205–2209, when Ti(t-$BuO_2$)$_2$(DPM)$_2$ precursors are used, (Ba, Sr)$TiO_3$ Films have superior step coverage relative to embodiments which employ Ti(DPM)$_2$ precursors. Because the sticking probability of the Ti(t-$BuO_2$)$_2$(DPM)$_2$ referenced by Kawahara is estimated to be about 0.02, and the sticking probability of the Ti(DPM)$_2$ is estimated to be about 0.1, a thin film having superior coverage can be obtained when the sticking probability is low.

According to Si-woo Lee et al., "Chemical Vapor Deposition Precursors for (Ba, Sr)$TiO_3$ Films", $6^{th}$ Korean Semiconductor Seminar, the deposition of Ti may be carried out using the surface reaction as a rate determining step, and high coverage may be achieved by virtue of the surface movement of Ti.

In view of all potential factors, and although not intending to be bound by any particular theory, it is believed that Ti precursors possessing low sticking probability are particularly suitable for forming thin films having a high degree of coverage, presumably due to relative ease of surface movement. With respect to precursor steric hindrance, since generally bulky precursors have a higher sticking probability than small precursors, the TAT-DMAE precursors may have a lower sticking probability than that of PET, and thus, this may explain the superior step coverage of TAT-DMAE.

Figure 11:
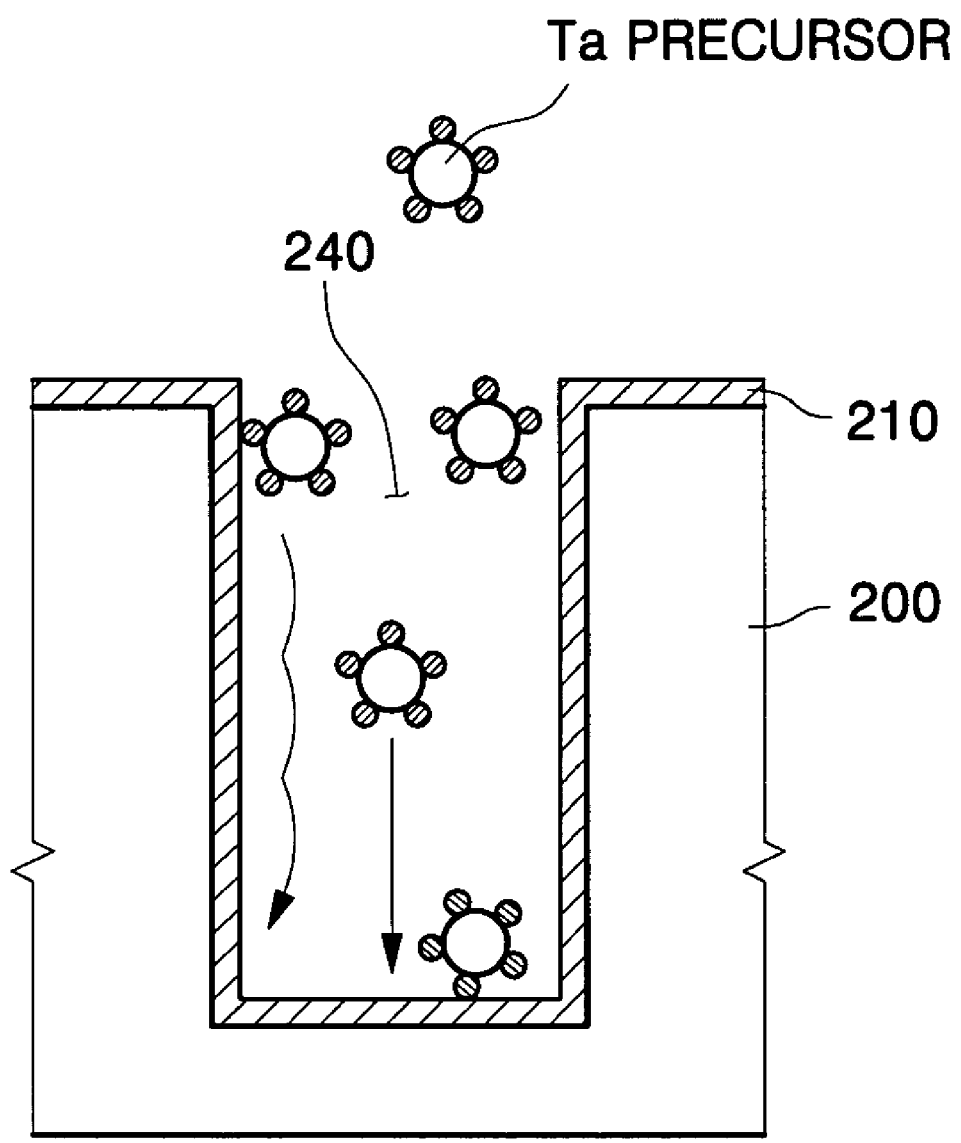
FIG. 11 is a cross-sectional view schematically illustrating an adsorption mechanism of gaseous tantalum precursors on a Ru lower electrode in accordance with an exemplary embodiment of the present invention.

FIG. 11 illustrates an adsorption mechanism of gaseous tantalum precursors on an Ru lower electrode according to an exemplary embodiment of the present invention. As reflected in FIG. 11, the mechanism in which the tantalum precursors reach the lower portion of the opening 240 formed by the Ru lower electrode 210 is believed to be attributable to: (a) surface movement 11 from the upper portion of the opening 240 or (b) direct transmission 12 to the lower portion of the opening 240. Accordingly, as shown in FIG. 9A or FIG. 10, in order to minimize or reduce oxidation of Ru in the lower portion of the Ru lower electrode 210, the provided tantalum precursors may be uniformly adsorbed and may cover the entire lower electrode 210 by surface diffusion or direct transmission.

In order to carry out this procedure in optimal fashion, surface movement of the precursors adsorbed on the substrate may be unencumbered, and the vapor pressure should be sufficiently high to accommodate a plurality of precursors. In particular, precursors such as TAT-DMAE according to exemplary embodiments of the present invention typically possess a higher vapor pressure and superior surface movement relative to conventional precursors such as PET, thereby forming a $Ta_2O_5$ layer exhibiting improved coverage.

Although the above exemplary embodiments illustrate $HfO_2$ films and $Ta_2O_5$ film, it is apparent to any person skilled in the art to apply an ALD process according to the present invention to various metal oxides such as $ZrO_2$, $Nb_2O_5$, $Al_2O_3$, $TiO_2$, $CeO_2$, $In_2O_3$ and $RuO_2$.

In case of $Al_2O_3$, aluminum alkoxide precursors such as $Al[OC_2H_5]_3$ or $Al(OCH(CH_3)_2)_3$ and an activated oxidant such as $O_3$, plasma $O_2$, remote plasma $O_2$ or plasma $N_2O$ may be used. A $TiO_2$ film may be deposited by ALD process using titanium alkoxide precursors such as $Ti[OC_2H_5]_4$ or $Ti(OCH(CH_3)_2)_4$ and an activated oxidant. In the case of $Nb_2O_5$, a niobium alkoxide precursor such as $Nb[OC_2H_5]_5$ may be used. In case of $ZrO_2$, a zirconium alkoxide precursor such as $Zr(OtBu)_4$ may be used.

According to exemplary embodiments of the present invention as described above, a thin film is deposited by ALD process using one or more metal alkoxide precursors and one or more activated oxidants that contain no hydroxyl group. The thin film manufactured by exemplary embodiments of the present invention show improved dielectric characteristics including reduced leakage current and improved step coverage.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming a capacitor for a semiconductor device comprising, in order:
   (a) forming a first electrode on a semiconductor substrate;
   (b) exposing the first electrode to a first alkoxide;
   (c) chemisorbing a first portion of the first alkoxide onto the first electrode to form a first alkoxide layer;

(d) exposing the first alkoxide layer to plasma $N_2O$;

(e) chemically reacting the first alkoxide layer and a portion of the plasma $N_2O$ to form a dielectric layer on the first electrode; and (f) forming a second electrode on the dielectric layer.

2. A method of forming a capacitor for a semiconductor device according to claim 1, wherein the dielectric layer includes at least one insulating material selected from the group consisting of $HfO_2$, $ZrO_2$, $Ta_2O_5$, $Y_2O_3$, $Nb_2O_5$, $TiO_2$, $CeO_2$, $In_2O_3$, $RuO_2$, $MgO$, $SrO$, $B_2O_3$, $SiO_2$, $Geo_2$, $SnO_2$, $PbO$, $PbO_2$, $V_2O_3$, $La_2O_3$, $As_2O_5$, $As_2O_3$, $Pr_2O_3$, $Sb_2O_3$, $Sb_2O_5$, $CaO$, and $P_2O_5$.

3. A method of forming a capacitor for a semiconductor device according to claim 1, wherein the first alkoxide includes a hafnium alkoxide.

4. A method of forming a capacitor for a semiconductor device according to claim 3, wherein the hafnium alkoxide includes at least one alkoxide selected from the group consisting of $Hf(OEt)_4$, $Hf(OPr)_3$, $Hf(OBu)_4$, $Hf(OnBu)_4$, $Hf(OtBu)_4$, $Hf(mmp)_4$, $Hf(OtBu)_2(dmae)_2$, $Hf(OtBu)_2(mmp)_2$ and $Hf[OSi(C_2H_5)]_4$.

5. A method of forming a capacitor for a semiconductor device according to claim 1, further comprising:

(c2) removing a non-chemisorbed portion of the first alkoxide from the first electrode before exposing the first alkoxide layer to plasma $N_2O$; and (e2) removing a non-reacted portion of the plasma $N_2O$ from the first electrode before forming the second electrode.

6. A method of forming a capacitor for a semiconductor device according to claim 1, wherein steps (b) to (e) are conducted at a temperature between about 100° C. and about 500° C.

7. A method of forming a capacitor for a semiconductor device according to claim 1, further comprising:

(b2) exposing the dielectric layer to a second alkoxide;

(c2) chemisorbing a first portion of the second alkoxide onto the dielectric layer to form a second alkoxide layer;

(d2) exposing the second alkoxide layer to plasma $N_2O$; and (e2) chemically reacting the second alkoxide layer and a portion of the plasma N20 to form a second dielectric layer on the dielectric layer;

wherein steps (b2) through (e2) are completed before forming the second electrode.

8. A method of forming a capacitor for a semiconductor device according to claim 7, wherein the first alkoxide and the second alkoxide include different metals.

9. A method of forming a capacitor for a semiconductor device according to claim 8, wherein the first alkoxide includes hafnium and the second alkoxide includes aluminum.

10. A method of forming a capacitor for a semiconductor device comprising:

forming a first electrode on a semiconductor substrate;

forming a dielectric layer on the first electrode by chemisorbing an alkoxide vapor onto a surface of the first electrode to form an alkoxide layer and reacting the alkoxide layer with plasma $N_2O$ to form a layer of insulating material on the surface of the first electrode; and forming a second electrode on the dielectric layer.

* * * * *